(12) United States Patent
Gueissaz

(10) Patent No.: US 6,454,160 B2
(45) Date of Patent: Sep. 24, 2002

(54) METHOD FOR HERMETICALLY ENCAPSULATING MICROSYSTEMS IN SITU

(75) Inventor: François Gueissaz, Wavre (CH)

(73) Assignee: Asulab S.A., Bienne (CH)

( * ) Notice: Subject to any disclaimer, the term of this patent is extended or adjusted under 35 U.S.C. 154(b) by 0 days.

(21) Appl. No.: 09/726,015

(22) Filed: Nov. 30, 2000

(30) Foreign Application Priority Data

Dec. 15, 1999 (EP) .............................. 99125008

(51) Int. Cl.[7] .................. B23K 31/02; B23K 35/12; G02B 6/36
(52) U.S. Cl. .................. 228/256; 228/179.1; 385/88; 257/678; 438/106; 438/118
(58) Field of Search ................. 228/256, 179.1, 228/180.22; 29/830; 437/195; 438/106, 118; 257/678, 693–703; 385/88–92

(56) References Cited

U.S. PATENT DOCUMENTS

| | | | |
|---|---|---|---|
| 4,661,886 A | * 4/1987 | Nelson et al. | 257/729 |
| 4,696,851 A | * 9/1987 | Pryor | 428/210 |
| 4,727,633 A | * 3/1988 | Herrick | 228/122 |
| 4,872,934 A | * 10/1989 | Kameda | 156/250 |
| 5,196,377 A | * 3/1993 | Wagner et al. | 438/107 |
| 5,336,928 A | * 8/1994 | Neugebauer et al. | 257/758 |
| 5,548,099 A | 8/1996 | Cole, Jr. et al. | |
| 5,687,267 A | * 11/1997 | Uchida | 385/137 |
| 5,719,073 A | * 2/1998 | Shaw et al. | 148/DIG. 50 |
| 5,841,190 A | * 11/1998 | Noda et al. | 257/668 |
| 5,863,812 A | * 1/1999 | Manteghi | 438/108 |
| 5,948,255 A | * 9/1999 | Keller et al. | 210/321.84 |
| 5,998,228 A | * 12/1999 | Eldridge et al. | 438/15 |
| 6,164,837 A | * 12/2000 | Haake et al. | 385/88 |
| 6,181,569 B1 | * 1/2001 | Chakravorty | 361/761 |
| 6,300,168 B1 | * 4/2001 | Takeuchi | 438/122 |
| 6,324,068 B1 | * 11/2001 | Shimizu et al. | 361/777 |
| 6,356,686 B1 | * 3/2002 | Kuczynski | 385/14 |
| 6,392,158 B1 | * 5/2002 | Caplet | 174/255 |

FOREIGN PATENT DOCUMENTS

DE   197 35 041   2/1998

* cited by examiner

Primary Examiner—Tom Dunn
Assistant Examiner—L. Edmondson
(74) Attorney, Agent, or Firm—Sughrue Mion, PLLC

(57) ABSTRACT

The method for hermetically encapsulating microsystems in situ consists, in a first phase, of mounting on a common substrate (1), several microsystems (6) surrounded by a metal adhesion layer (4) deposited on the substrate (1). In a second phase, in a common deposition step a first metal layer (7) is deposited by electrolytic means on each microsystem (6) and on an annular zone (7a) of the adhesion layer (4) surrounding each microsystem (6), so as to completely cover each microsystem by overlap. Subsequently a second metal layer (9) is deposited by electrolytic means on the first metal layer (7) and on the adhesion layer so as to cover most of the first layer with the exception of at least one passage (10) per microsystem (6), providing access to the first layer (7). The metal of the first layer is different from the metals of the adhesion layer, the second layer and the microsystem. The first layer (7) is removed by selective chemical etching through the passages (10) which are closed to obtain metal capsules hermetically enclosing each microsystem.

19 Claims, 12 Drawing Sheets

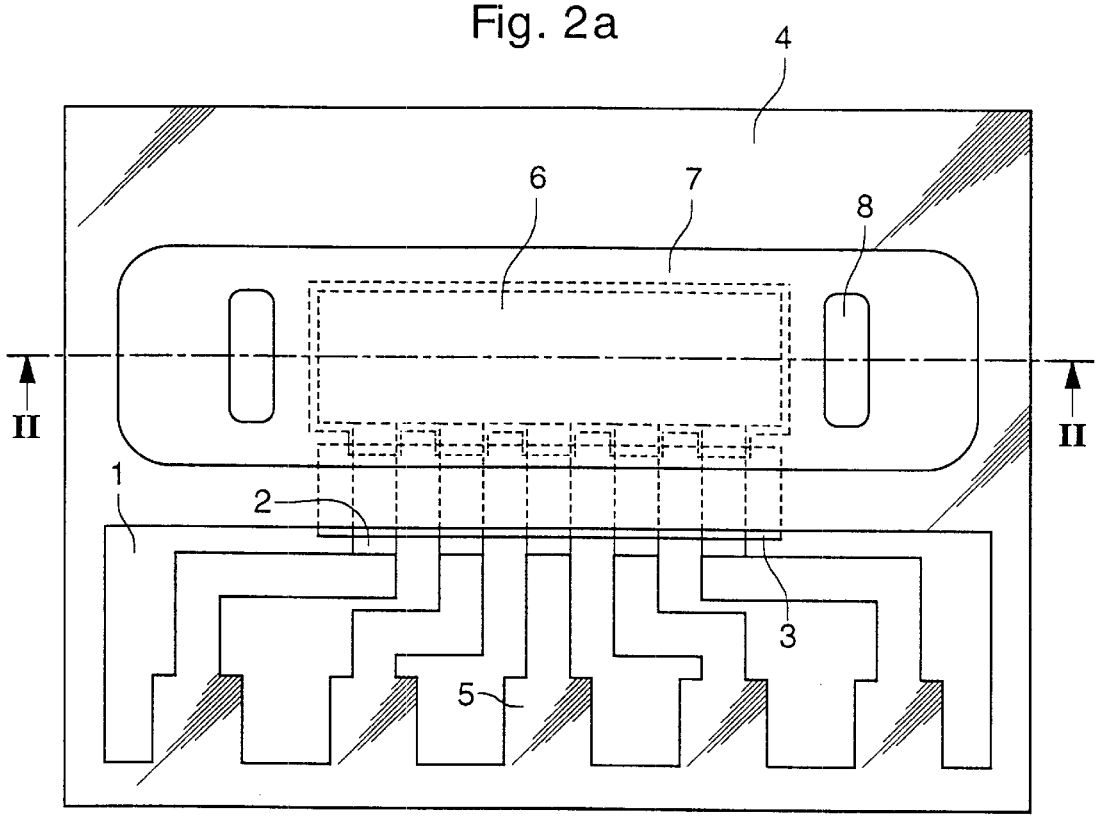
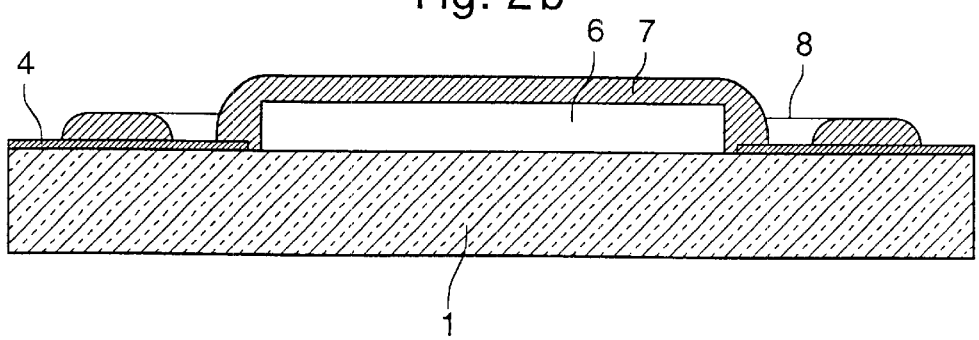

METHOD FOR HERMETICALLY ENCAPSULATING MICROSYSTEMS IN SITU

BACKGROUND OF THE INVENTION

The present invention concerns a method for hermetically encapsulating microsystems in situ. At least one microsystem mounted on a substrate is encapsulated under a metal capsule made in situ. "Mounted" means either placing the microsystem, made beforehand, on the substrate, or making the microsystem in situ on the substrate. Preferably, several microsystems of micrometric dimensions are manufactured together on the same substrate. The encapsulation enclosing the microsystem must be sealed hermetically and leave said microsystem free of movement inside the capsule.

"Microsystems" means three-dimensional structures, i.e. microoptoelectromechanical devices (MOEMS) or microelectromechanical devices (MEMS) such as reed contactors, accelerometers, micromotors, sensors of micrometric size, which need to be left free to move after encapsulation. The construction of said microsystems can be made on an insulating substrate or on a substrate comprising integrated circuits which have been made beforehand. In this latter case, it is possible to use the metal contact pads of the integrated circuit to begin depositing the metal layers which will form part of the microsystem and to allow it to be electrically connected to said circuit.

Swiss Patent No. 688213, by the same Applicant, discloses a reed contactor or contactor with strips of micrometric size and the manufacturing method thereof. The contactor comprises metal strips at a distance from each other in the rest state which are made by electrolytic means in several steps and are attached to a base plane. The strips are formed of an iron and nickel alloy, deposited by an electrolytic method. This alloy has the property of being ferromagnetic so that the strips are able to be put in contact with each other when a magnetic field passing through them creates a force of attraction therebetween. This contactor is encapsulated under a hollow cover which is fixed for example using an epoxy adhesive material onto the base plane. The latter may be a glass substrate or an insulating layer obtained by oxidising the surface of a silicon substrate. The cover is formed of a glass plate in which cavities are formed by chemical etching. This plate allows each contactor to be enclosed in each of the etched cavities. The plate may be bonded onto the base plane or soldered by an eutectic or anodic solder. In a final operation, the multitude of contactors thereby made and sealed are separated by cutting or dicing operation.

In this type of embodiment, it is necessary to machine the glass plate separately from the substrate on which the contactors are manufactured. This constitutes a drawback. Moreover, the plate has to be bonded precisely onto the base plane using an epoxy adhesive material. The sealing is not hermetic over the long term, since the epoxy resin absorbs water and degasses substances capable of disturbing the operation of the contactor. In other embodiments, an heat treatment for encapsulating the contactor can be destructive.

In Swiss Patent No. 688213 it will also be noted that during contact resistance measurements between the metal strips, prior to encapsulation of the contactors, the contact resistance average of all the contactors made on a same substrate was centred around 10 ohms. After said encapsulation, this contact resistance average was measured rising to 10 to 60 ohms.

European Patent No. 0 302 165 discloses a sheet of tin which is formed by stamping to act as the metal dome for an integrated circuit. This stamped sheet is then bonded onto a base plate where the integrated circuit is placed so as to close said circuit under the dome. The whole assembly is subsequently coated with a layer of polyethylene. The adhesive material, as explained above, can cause contamination of the microsystem. Consequently it does not allow hermetic encapsulation to be guaranteed. It is also not possible to design the dome in situ by stamping. Moreover, making these stamped sheets, which have to be individually placed on each microsystem, complicates the encapsulation of several microsystems mounted on a same substrate.

In the field of combined micromechanical and electronic devices, the use of sacrificial layers is already known. One can cite the case in which one wishes for example to make a metal bridge between an integrated circuit and a sensor. On the other hand in the case of making an hermetic metal encapsulation for microsystems, the use of sacrificial layers is not known.

U.S. Pat. No. 5,798,283 discloses a method for manufacturing at least one microelectronicmechanical device with an electronic circuit. A cavity is etched in the substrate for example made of silicon in order to house therein the micromechanical device. The latter is constructed using different layers of polysilicon in order to obtain elements able to be free of movement. The device has to be protected using layers of silicon oxide or nitride so that the subsequent steps for making the integrated circuit can be performed. This protection of the micromechanical device is necessary to protect it against dopant diffusion temperature (boron, phosphorous for example) which can be higher than 700° C. Such temperature can partly destroy the elements of said micromechanical device designed with certain metals with a low melting point. Such protecting layers also allow to avoid doping said elements if polysilicon is involved to be avoided.

Once the integrated circuit operations are finished, two openings arranged in a protective layer disposed above layers of SiO2 or Si3N4 allow said layers of SiO2 or Si3N4 to be partly removed by chemical etching. That allows thus to release the micromechanical device and to leave it free of movement. During such removal, precautions must be taken to avoid too great a lateral etching, because the integrated circuit is constructed beside the micromechanical device.

Instead of making two openings in the protective layer, it might have been envisaged to use only one layer of porous polysilicon in order to remove the layers of SiO2 or Si3N4 by chemical etching, in particular using fluorohydric acid, through the polysilicon, and then to rinse with deionised water.

Several drawbacks of said method from this document can be cited. Firstly, the encapsulation is made using non-metallic layers. Moreover, a cavity has to be arranged beforehand in the substrate to house therein the microsystem by etching techniques similar to those used in the microelectronic field. The microsystem has also to be protected while the corresponding integrated circuit is being made with layers which can withstand high temperatures. Consequently, there is no question of depositing metal layers in particular by electrolytic means on said micromechanical device to create an hermetic metal encapsulation.

European Patent No. 0 435 530 discloses an electronic system hermetically sealed by metal layers one of which is deposited by electrolytic means. The electronic system is an association of different integrated circuits, with high density interconnection (HDI). These circuits are housed and bonded using polymers in a cavity micro-machined in a glass or ceramic substrate. A first metal layer, in particular made of chromium or titanium, is sputtered onto a dielectric layer which overhangs the interconnections made for the different circuits. This first layer allows to coat the entire structure and to come into contact with the surface of the substrate. Subsequently, a second metal layer is deposited by electrolytic means above the first layer in order to create a thicker protective layer against various contaminating elements able to disturb the circuits.

European Patent No. 0 435 530 provides no teaching for making an encapsulation for microsystems, such as reed type contactors. One drawback is that the polymers used to bond the circuits, produce gases, i.e. degas. That thus creates defects which will be noticeable as regards the proper operation of the contactor. Moreover, it is to be noted that creating a metal capsule via a sacrificial metal layer removed after deposition of a subsequent metal layer forming the capsule, is not envisaged.

SUMMARY OF THE INVENTION

One object of said invention is to provide an hermetic encapsulation in situ for microsystems which overcomes the drawbacks of the aforecited prior art.

Another object of the present invention is to be able to make a metal capsule via electrodeposition of metal layers for encapsulating microsystems at temperatures lower than 350° C. maximum. This overcomes the drawbacks of methods of prior art wherein, in particular, the diffusion of phosphorus or boron for integrated circuits occurs at temperatures exceeding 700° C. and able even to reach 1300° C.

Another object of the invention is to avoid a large dispersion of contact resistance values after hermetic encapsulation. The microsystem can be a contactor which has to be in an inert or reducing atmosphere.

These objects, in addition to others are achieved as a result of the method for hermetically encapsulating microsystems in situ wherein, in a first phase, several microsystems are mounted on a common substrate, said microsystems being surrounded by a metal adhesion layer deposited on the substrate, the method being characterised in that, in a second phase, in a common deposition operation a first metal layer is deposited on each microsystem and on an annular zone of the adhesion layer surrounding each microsystem so as to completely cover each microsystem by overlap, in that a second metal layer is deposited by electrolytic means on the first layer and on the adhesion layer so as to cover the first layer over most of its surface leaving at least one passage per microsystem in the second layer to provide access to the first layer, the metal of the first layer being different from the metals of the adhesion layer, the second layer and the microsystem, in that the first layer is removed by selective chemical etching through each passage arranged in the second layer, and in that each passage in the second layer is closed or sealed to obtain metal capsules hermetically enclosing each microsystem.

One advantage of the method of the invention consists in making an hermetic metal encapsulation using means which allow simultaneously processing of substrates on which several microstructures have been mounted. The microstructures are made for example in situ onto the substrate. However, they can be made too beforehand and placed after onto the substrate.

Another advantage of the method of the invention lies in the fact that the metal capsule made on the substrate and enclosing the microsystem is held without the use of adhesive materials. Said adhesive materials may contain polymers capable of degassing contaminating elements inside the metal capsule, liable to disturb the microsystem.

The creation of a metal encapsulation for microsystems using depositions of metal layers has thus been envisaged. One of metal layers acts as a sacrificial layer. Moreover, at least the final metal layer is deposited by electrolytic means on a metal adhesion layer which adheres well to the insulating surface of the substrate.

In order to make this capsule, a first metal layer, called the sacrificial layer is deposited, preferably by electrolytic means, onto the whole of the microsystems and onto annular zones of the adhesion layer surrounding each microsystem. The first layer allows to completely cover each microsystem by overlapping. After this first metal layer has been deposited, the covered microsystems have a dome shaped appearance. A second metal layer is then deposited by electrolytic means onto the first layer, said second layer having passages providing access to the first layer.

The first metal layer is formed of a different metal to the metals forming the second layer, the adhesion layer and also the microsystem. This first layer is able to act as the sacrificial layer to be removed selectively by chemical etching through at least one passage made in the second metal layer in order to make the metal capsule. In a final encapsulation step, it is necessary to close or seal the passage or passages made in the second layer in order to hermetically close the capsule while keeping inside the capsule the microsystem in an inert or reducing atmosphere.

"Metal" also includes all the metal alloys depending on a particular metal.

This electrodeposition technique allows high quality encapsulation of microsystems at a low cost.

Another advantage of the method of the invention is that it avoids having to protect the microsystem for the subsequent manufacture of the integrated circuit arranged next to it as described in U.S. Pat. No. 5,798,283. In the case for example of a microcontactor, these encapsulation steps even occur at the ambient temperature.

In a preliminary phase of the method, one may for example form on a substrate, of which at least one surface is insulating, conductive strips for the electric connection of the microsystem with the exterior. An insulation of the median portion of the strips is then made. Moreover, a surface metallisation connects one end of the strips and also passes above the insulation of the strips. Also in this first phase of the method, the microsystem to be encapsulated is mounted on the substrate. In a second phase, the metal capsule is formed with the closing of its orifices. The substrate may be cut subsequently to obtain a multitude of encapsulated microsystems.

The invention will be better understood with reference to the drawings showing non limiting embodiment examples of the method of the invention in which:

BRIEF DESCRIPTION OF THE DRAWINGS

FIGS. 2a and 2b show a top view and a cross-section along II—II of FIG. 2a after the deposition of a sacrificial metal layer on the microsystem and on the adhesion layer according to a first embodiment;

FIGS. 1 to 5 show the different steps of the hermetic encapsulation in situ of microsystems according to a first embodiment of the method of the invention. For purpose of simplification, a single microsystem is shown in said Figures, whereas in reality, several microsystems are mounted on a common substrate in order to be encapsulated simultaneously.

DETAILED DESCRIPTION OF THE INVENTION

Figure 1A:
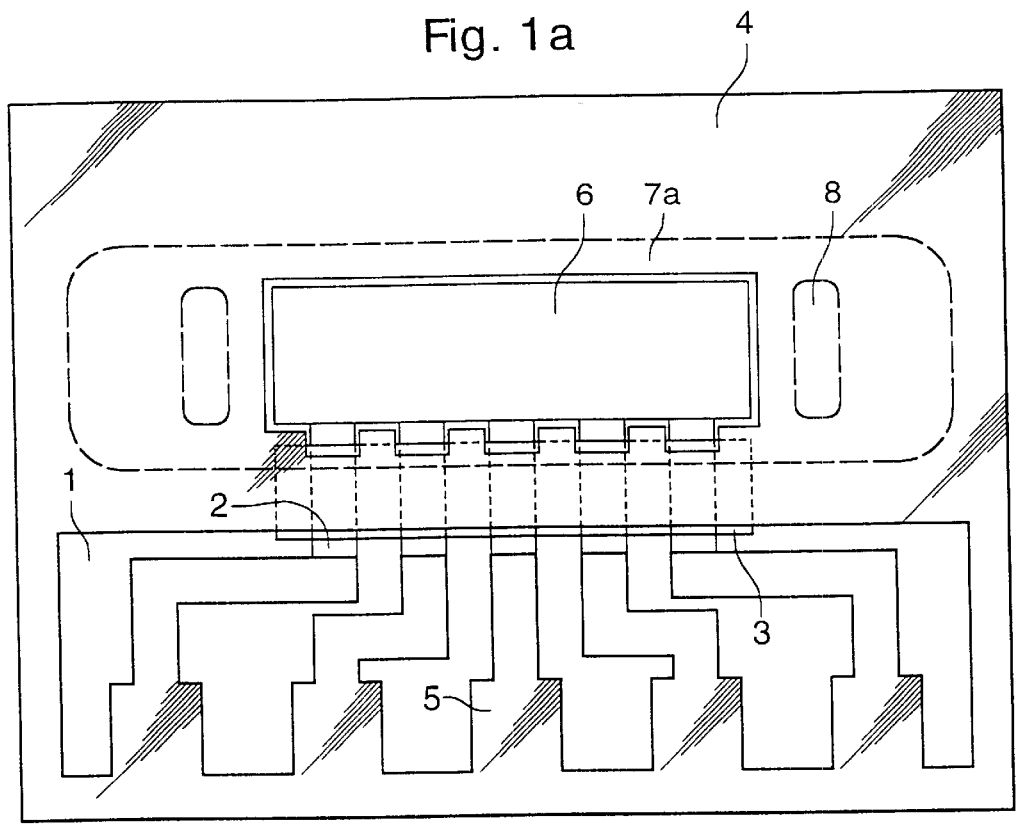
FIG. 1a shows the first step of the method according to the invention with a portion of a substrate on which conductive strips with insulation, an adhesion layer and a microsystem have been made.
Figure 1B:
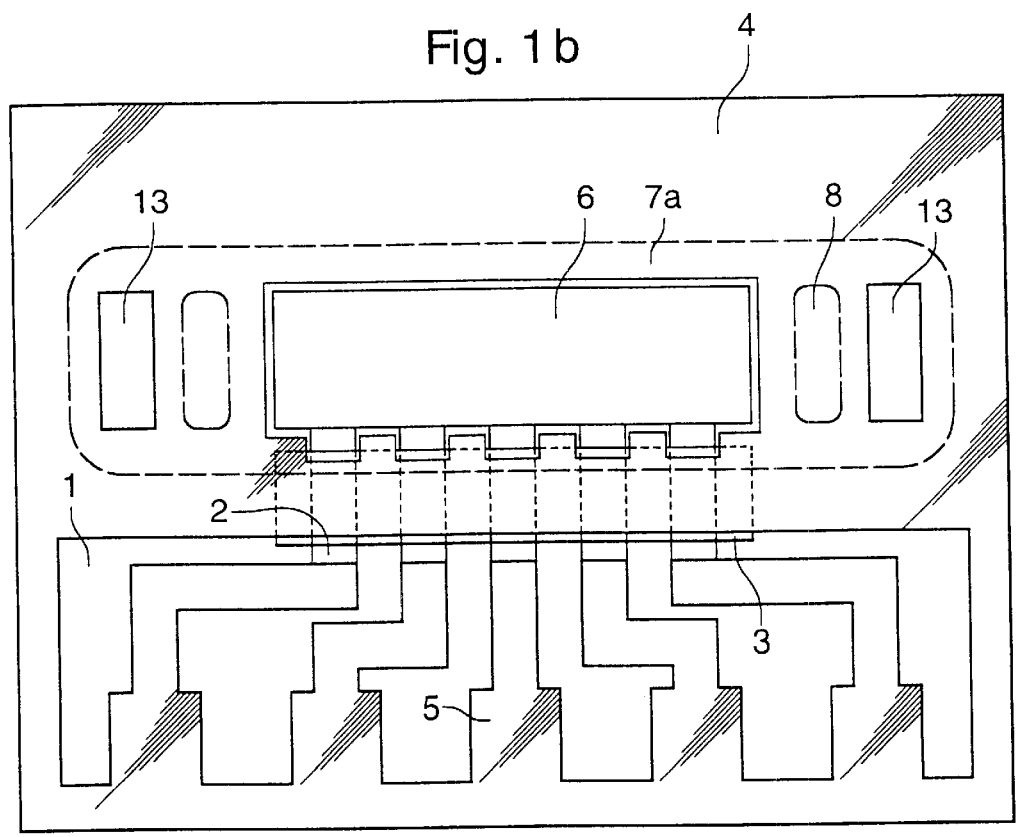
FIG. 1b shows the first step of the method according to the invention with a portion of a substrate on which conductive strips with insulation, an adhesion layer with solder bumps and a microsystem have been made.

FIGS. 1a and 1b show a portion of a substrate 1, which may be entirely insulating such as a glass or ceramic plate, or a substrate, for example made of silicon, the surface of which is oxidised to become insulating. The dimensions of the substrate may be those of a silicon substrate on which integrated circuits are made, for example of 6 inches (152.4 mm). This portion of the substrate visible in FIGS. 1a and 1b corresponds to the dimensions for one of the microsystems made in common on the same substrate.

In a first phase of the method shown in FIGS. 1a and 1b, a conductive layer is deposited first of all on the insulating surface of substrate 1 and is structured so as to form conductive strips 2. An insulating layer 3 is then deposited only on the median part of conductive strips 2 to form thus insulated electric paths. Finally, a metal adhesion layer 4 is deposited on the substrate passing over insulating layer 3. This adhesion layer gives a surface metallisation able to define electric terminals 5 connected only to one of the ends of the conductive strips for the electric connection of the microsystem after the sawing or dicing of the substrate. This adhesion layer is able to withstand construction of the microsystem and the capsule. It forms finally a conductive plane for the electrolytic deposition steps which allow metal layers of significant thickness to be obtained.

The conductive layer forming conductive strips 2 must adhere well to the substrate and allow the subsequent insulating layer 3 to adhere well. This conductive layer must also be compatible with metal adhesion layer 4 and have low electric resistance at the interface of the connection of the two metal layers. It is important that the leading edges do not have a negative slope, or form a cornice, in order that the insulating layer covers them perfectly. Conductive strips 2 may be made of a material such as aluminium, gold, titanium, copper, chromium, tungsten or titanium-tungsten alloy. These strips are useful for the electric connection of the microsystem with the exterior after its encapsulation.

The insulating layer must adhere well to insulating substrate 1 and to conductive strips 2, for example like a layer of silicon or silicon nitride Si3N4. Moreover, it must contain little internal stress, have a thermal expansion coefficient close to that of the substrate and perfectly cover the leading edges of the conductive strips.

Metal adhesion layer 4 must adhere well to substrate 1 and insulating layer 3. It may be made as specified by Swiss Patent No. 688213, i.e. by depositing first of all titanium or chromium which is then covered with gold which acts as a protection layer against oxidation. This second metal layer acts as a metal base surface for the electrodeposition of the subsequent metal layers. The chemical etching products for structuring these first metal layers are known and consequently will not be explained. An annular zone 7a is shown in dotted lines in FIGS. 1a and 1b to show the location of the deposition of a subsequent metal layer.

In the event that soldering is used on the adhesion layer, it is necessary to provide a base layer of the adhesion layer, said base layer being made of three metal levels. The first metal level is formed of titanium or chromium and enables it to be fixed to the substrate. The second metal level is formed of nickel or palladium or rhodium or ruthenium or platinum or molybdenum or another material in order to act as a diffusion barrier if there is a solder. Finally the third metal level is formed of gold to act as a protection layer against oxidation, in particular for the first metal level.

In FIG. 1b, solder bumps 13 of gold and tin alloy (Au—Sn) or tin and lead alloy (Sn—Pb) may also form part of the adhesion layer at determined locations. These solder bumps are used as will be seen hereinafter to better close the passages made in the metal capsule during thermocompression of portions of the capsule onto said bumps. The gold-tin alloy is formed of 20% tin and 80% gold in weight, whereas the tin-lead alloy is formed of 60% tin and 40% lead in weight.

In embodiments which are not shown in the Figures, instead of conductive strips 2, one could have made conductive holes passing through insulating parts of the substrate or through the substrate if it is entirely insulating or insulated conductive holes in a conductive substrate. An insulating substrate can be a glass or ceramic plate. On one side of the substrate these holes connect microsystem 6 and on the other side they are electrically connected to metal pads allowing the microsystem to be connected to the exterior once it is encapsulated.

It is clear that insulating step 3 of conductive strips 2 is not taken into account if conductive holes have been made through the substrate as in the embodiment indicated hereinabove.

In the event that conductive strips 2 are replaced by conductive holes, in particular metallised holes, the adhesion layer is not structured to define metal paths with metal electric connection pads of the microsystem. These pads are made in this case on the back of the substrate. This adhesion layer need only to surround each microsystem for the deposition by electrolytic means of the metal layers for making the capsule.

In the event that a silicon substrate is used as a support for the microsystems, the conductive strips deposited on the substrate may be replaced by conductive paths in the silicon. These paths are made by a diffusion step with a p-type dopant in an n-type substrate or with an n-type dopant in a p-type substrate. The metal connection of each end of said conductive paths is achieved through windows made on insulation layer made of silicon oxide. One advantage of this embodiment is that it assures electrostatic protection.

Microsystem 6, which may for example be a reed contactor, is constructed or mounted without damaging the previously deposited layers. For the construction of a contactor with its metal strips, electrodeposition techniques are also used, for example by structuring the metal levels in several steps using photoresist and masks to expose them, as described in Swiss Patent No. 688 213. The microsystem thereby formed is connected to one end of conductive strips 2 or to conductive holes.

Instead of making said microsystems in situ, they may be manufactured separately and then each fixed onto a same substrate in electric connection at one end of the conductive strips or conductive holes provided for this purpose.

In FIGS. 2a and 2b, a first sacrificial metal covering layer 7 is deposited in particular by electrolytic means onto the microsystems and onto annular zones 7a, visible in FIGS. 1a and 1b, around each microsystem. In this way, the first metal layer, which is in particular made of copper or a copper alloy, completely covers each microsystem.

The metal adhesion layer is not dissociated from one microsystem to another. It can be thus used for the electrodeposition of various parts of the first layer covering all the microsystems. So one location of the adhesion layer on the substrate is connected to a terminal of a power source. In this embodiment, one or two openings 8 in each part of the first layer are also provided inside each annular zone. Said openings provide access to adhesion layer 4 to be used to form one or two metal support pillars during deposition of the next metal layer.

This first sacrificial layer 7 is formed of a metal, such as copper or a copper alloy, which can be selectively dissolved with respect to the other metal layers which are formed of different metals. It must contain little internal stress and have good levelling properties.

For the electrodeposition of this sacrificial layer, the microsystems and the adhesion layer are first of all covered with a photoresist layer. The photoresist is exposed through a mask in order to remove parts of the photoresist which have been exposed or not exposed depending on the type of photoresist. The parts of photoresist removed aim to free each microsystem and an annular zone of the adhesion layer surrounding each microsystem. The first metal layer can thus be deposited onto each microsystem and onto the annular zone surrounding it. Subsequently, the rest of the photoresist is removed to have access to the adhesion layer through the openings 8 made in the first layer and around each covered microsystem. One part of the annular zone of the adhesion layer is situated above insulation 3 of the conductive strips. So, the deposition of the sacrificial metal layer only short circuits the ends of the strips connecting the microsystems.

In order to create these metal domes covering each microsystem, the metal layer may be deposited by a different method to electrolytic means. For example, said metal layer may be deposited by thermal evaporation or by cathodic sputtering without having to exceed the temperature limit of 350° C. However, these other methods are longer and thus more expensive.

Openings 8 of the first metal layer visible in FIGS. 2a and 2b are completely surrounded by the first layer. However, it is of course understood that they could have been designed to start from an edge of said first layer to give the appearance in a plane view of a U-shaped opening. Those skilled in the art will know how to find openings of all shapes allowing the creation of pillars or reinforcing parts during deposition of the second metal layer.

Figure 3A:
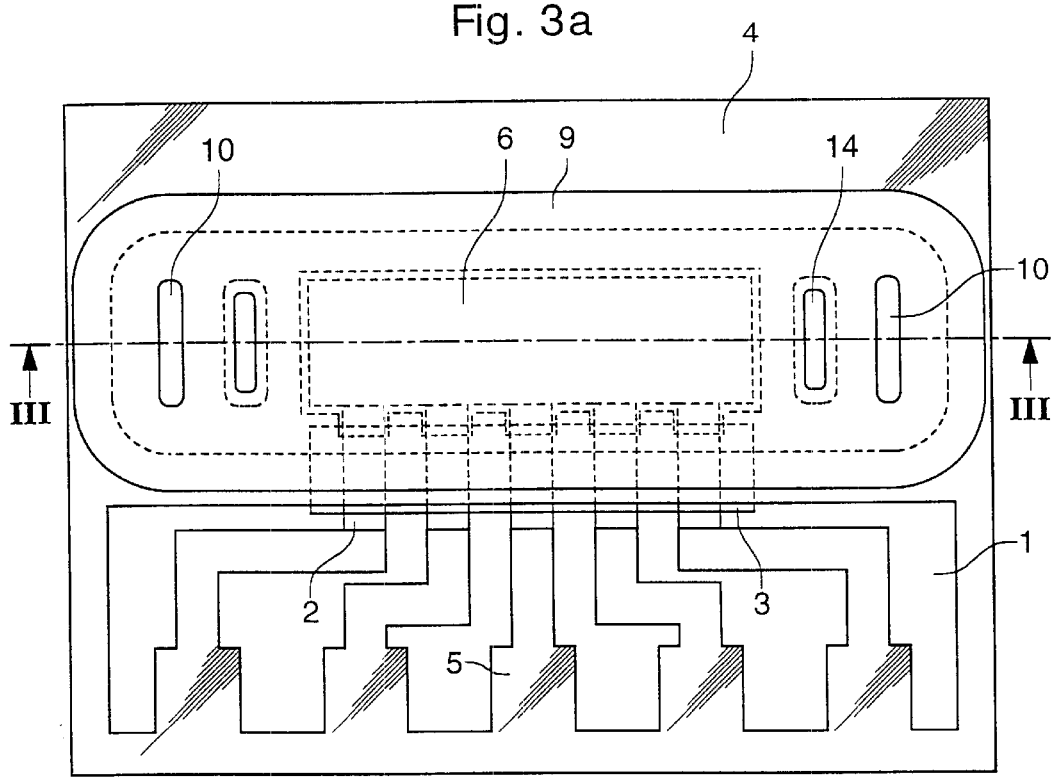
FIGS. 3a and 3b show a top view and a cross-section along III—III of FIG. 3a after the deposition of a second metal layer above the sacrificial layer which is formed of different metal and according to a first embodiment.
Figure 3B:
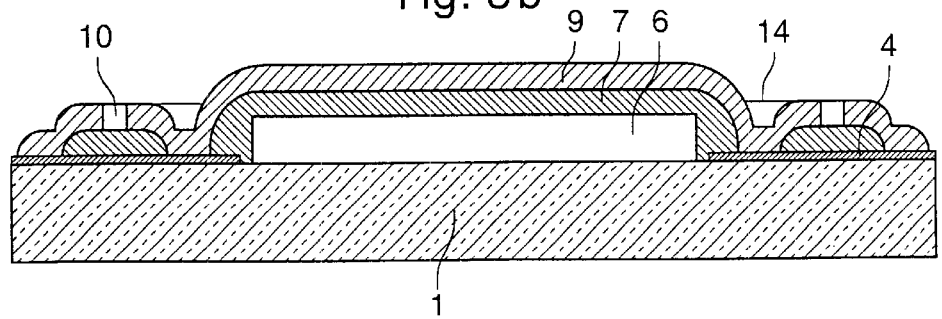

In FIGS. 3a and 3b, the metal capsule is made by depositing by electrolytic means a second metal layer 9 onto first sacrificial metal layer 7 and onto adhesion layer 4 or onto annular zones of the adhesion layer surrounding parts of the first layer. Said second layer 9 is formed of another metal, such as preferably gold or a gold alloy, or possibly chromium or a chromium alloy. One or two facing passages 10 are provided in said second layer 4 to provide access to first sacrificial layer 7 in order to dissolve it selectively with respect to the other metal layers. Said passages 10 are shown with an oblong shape, but it is clear that they could also be of circular or square shape.

Each pillar 14 or reinforcing part made by deposition of said second layer 9 is arranged between one of passages 10 and the corresponding microsystem 6. This capsule consequently has an hermetic closing on its periphery with the exception of the two passages 10. Moreover, the two support pillars 14 of the capsule are able to contain any deformation which could be caused during the final closing step of the passages of the capsule. Said metal of the capsule must also be malleable and contain little internal stress and have good coating properties and very low porosity.

The first sacrificial layer 7 surrounding each support pillar 14 can be removed by a chemical etchant, as explained with FIGS. 4a and 4b below. For the dissolution of the first layer, the chemical etchant passes through passages 10 of each capsule and around said pillars 14. Of course, only the first layer 7 need pass at least on one side of each pillar or reinforcing part, as explained hereinbefore, to be able to remove this layer during chemical etching step.

Although only one passage 10 and a single support pillar 14 could be envisaged to make the capsule, it is preferable to have two or more passages for removing sacrificial layer 7; by having for example two facing passages 10, this facilitates the removal of the sacrificial layer and cleaning of the inside of the capsule via the flow of treatment solutions.

As explained with reference to FIGS. 2a and 2b regarding the deposition of first metal layer 7, a photoresist layer (not shown) is also used. This photoresist is exposed through a mask to be able to remove parts of the photoresist in order to have access to the first layer and to annular zones of the adhesion layer surrounding each part of the first layer. The annular zones are located above insulation layer 3 and have no contact with the end of conductive strips 2 for the external electric connection of microsystems 6.

Of course, if conductive holes through substrate 1 are used for the external connection of microsystems 6, the deposition of second metal layer 9 may be made beyond the annular zones over the entire surface of the substrate. However, passages 10 have to be kept to provide access to sacrificial layer 7.

Figure 4A:
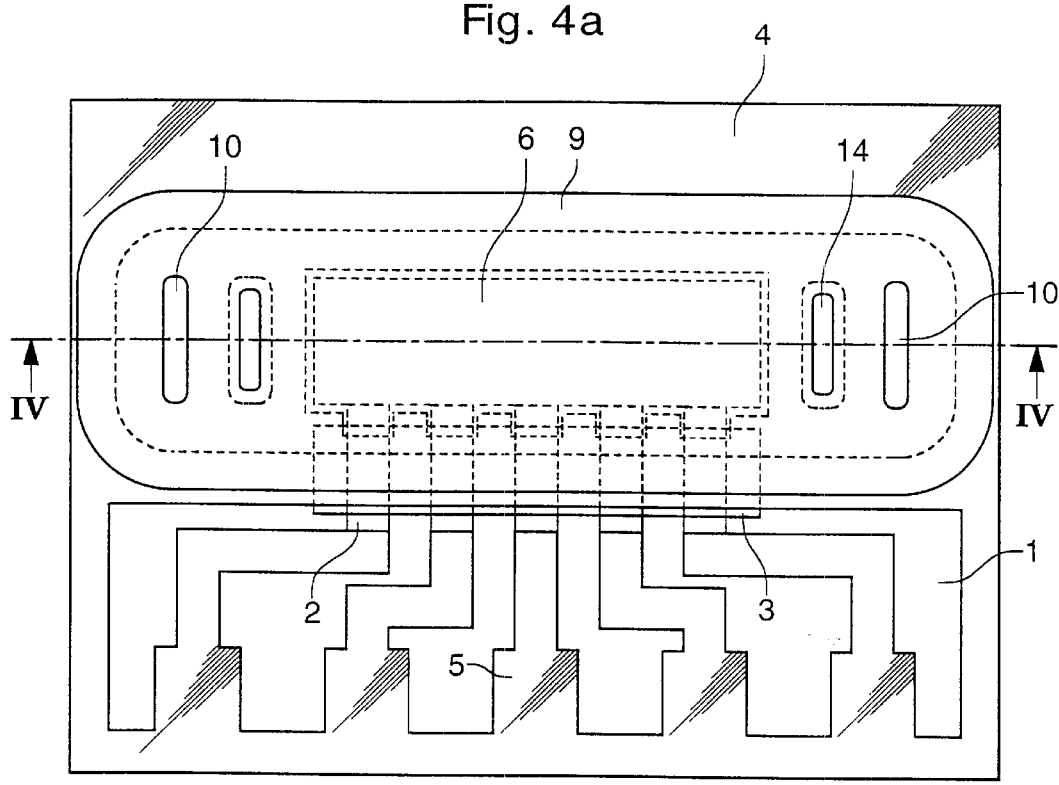
FIGS. 4a and 4b show a top view and a cross-section along IV—IV of FIG. 4a after the removal of the sacrificial layer by chemical etching through passages of the capsule thereby made according to a first embodiment.
Figure 4B:
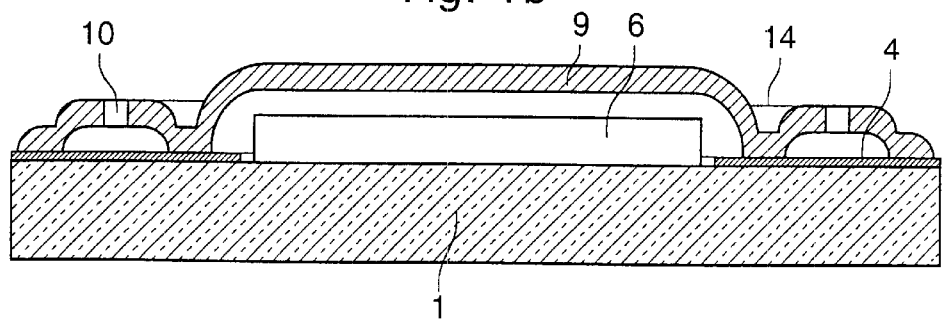

In FIGS. 4a and 4b, sacrificial covering layer 7 is dissolved by chemical etching through the two passages 10 selectively without etching the metals of microsystem 6, for example iron and nickel. The chemical etchant must not cause any damage to microsystem 6 or metal capsule 9 whether by chemical etching or by a violent reaction with sacrificial covering layer 7. There must also not be any residue inside the metal capsule, likely to degas after the final closing thereof.

Figure 5A:
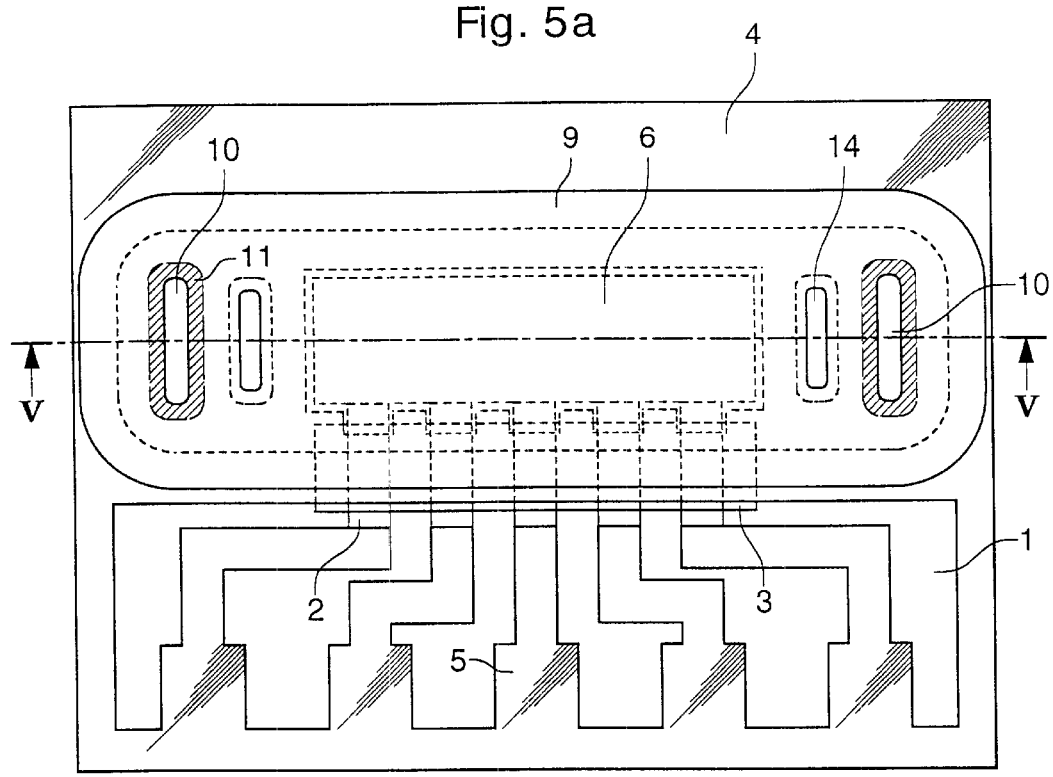
FIGS. 5a, 5b and 5c show a top view and cross-section along V—V of FIG. 5a after the closing of the passages of the metal capsule so as to hermetically encapsulate the microsystem according to a first embodiment.
Figure 5B:
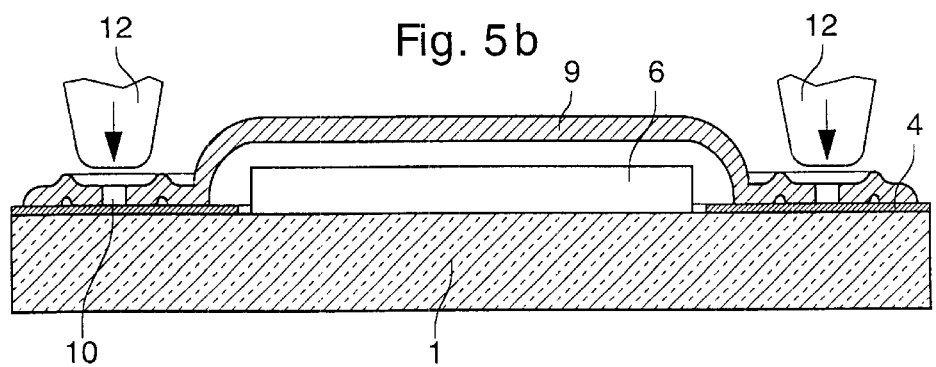

In FIGS. 5a and 5b, the encapsulated microsystems 6 are still secured to the substrate. In this step, passages 10 of the metal capsule must be closed in an inert or reducing atmosphere. A suitable tool 12, which sprays the inside of said capsule 9 with a protective gas, is brought near. Once the capsule has been cleaned of its original atmosphere, the tool compresses parts 11 around each passage 10. Then the tool bonds parts 11 by thermocompression or ultrasound onto the base layer of adhesion layer 4. After this operation, the metal capsule is sealed in an impervious manner. Support pillars 14, in this step, are used to prevent the deformation propagating in the direction of microsystem 6. Metal capsule 9 thus forms an hermetic protection above microsystem 6.

Figure 5C:
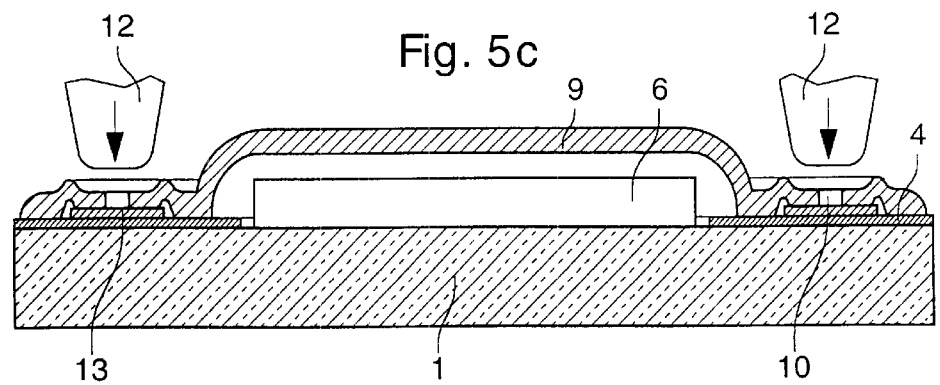

In FIG. 5c, to reduce the power necessary to close the capsule, solder bumps 13, forming part of the adhesion layer as described above, are provided. The thermocompression of parts 11 around passages 10 of metal layer 9 on said solder bumps assures melting of said bumps and the impervious closing of passages 10.

The final step, not shown in the Figures, consists in separating by cutting or dicing the multitude of encapsulated microsystems from the substrate. The encapsulated microsystems thus can be used for example in usual ambient conditions. It's even possible to coat each microsystem with a resin layer before or after cutting in order to assure better mechanical protection.

If final metal layer 9 was made of chromium, one could avoid making support pillars. As chromium is not ductile, one must avoid deforming it when passages 10 are being closed. In such case, it would be possible to close each metal capsule in an impervious manner by depositing on each passage a drop of solder to be solidified. However, gold or a gold alloy is better suited to making the capsule, since it is ductile and resists different chemical etchants.

Microsystem 6 constructed on the plate or insulating substrate, which may be a layer of silicon oxide made on a silicon wafer, has a total height of the order of 50 $\mu$m prior to its final encapsulation. The total height, when the metal capsule is finished, is of the order of 100 $\mu$m or even 150 $\mu$m maximum, with a thickness of the metal of the capsule of the order of 15 to 20 $\mu$m. Compact components are thus made by the method according to the invention.

In the event that all the steps of the method are implemented on a single face, one may also envisage reducing the thickness of the substrate by chemical etching of the back of substrate after encapsulation and before the substrate is cut or diced. In order to do this, one must take the required precautions so as to avoid damaging the side of the substrate bearing the encapsulated microsystems. However, if the substrate is thin from the start, this avoids having to reduce its thickness at the end of the encapsulation method.

As a result of the electrodeposition technique, metal layers of greater thickness can be deposited, which is difficult to achieve with thermal evaporation or cathodic sputtering. This electrodeposition technique allows less expensive and quicker manufacturing for such thicknesses even if gold is used to make the capsule. Comparatively, the design, according to the prior art, of a glass plate independent of the substrate wherein recesses are made to place or construct the microsystems and then enclose them is more time consuming and expensive.

FIGS. 6 to 9 show steps of the hermetic encapsulation in situ of microsystems according to a second embodiment of the method of the invention. It is to be noted that the elements of these Figures, which correspond to those of FIGS. 1 to 5, bear identical reference numbers.

Figure 6A:
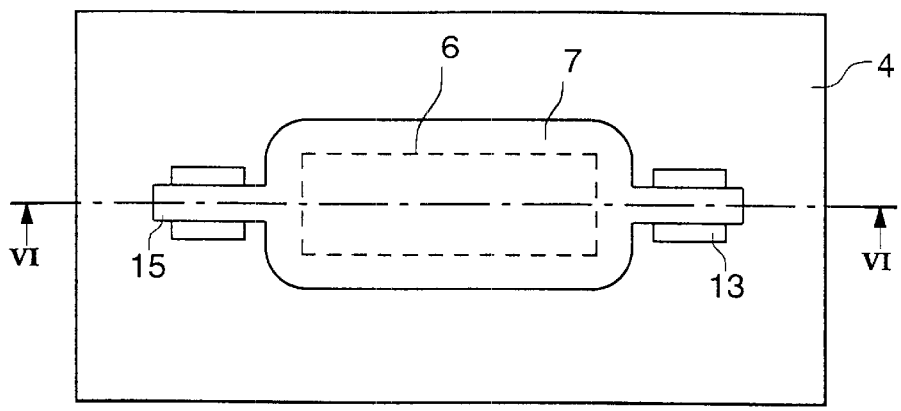
FIGS. 6a and 6b show a top view and a cross-section along VI—VI of FIG. 6a after the deposition of a sacrificial layer on the microsystem and on the adhesion layer which includes solder bumps according to a second embodiment.
Figure 6B:
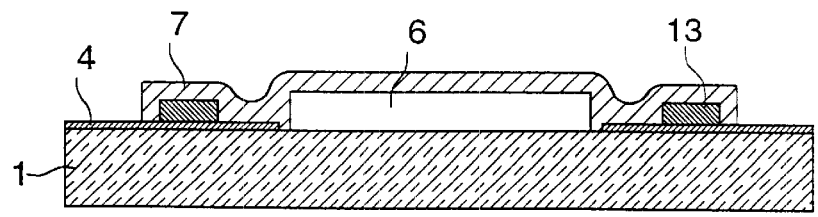

In FIGS. 6a and 6b in which the conductive strips and the insulating layer have not been shown, a first sacrificial metal layer 7, made in particular of copper or a copper alloy, is deposited in particular by electrolytic means, on an annular zone of adhesion layer 4 and on microsystem 6 to completely cover it. Two extensions 15 of sacrificial layer 7, of smaller width than that covering microsystem 6, pass above solder bumps 13 of adhesion layer 4. These two extensions 15, used to create the passages of the second metal layer which will be discussed hereinafter, are disposed, as well as the two solder bumps 13, on two opposite sides of sacrificial layer 7.

Figure 7A:
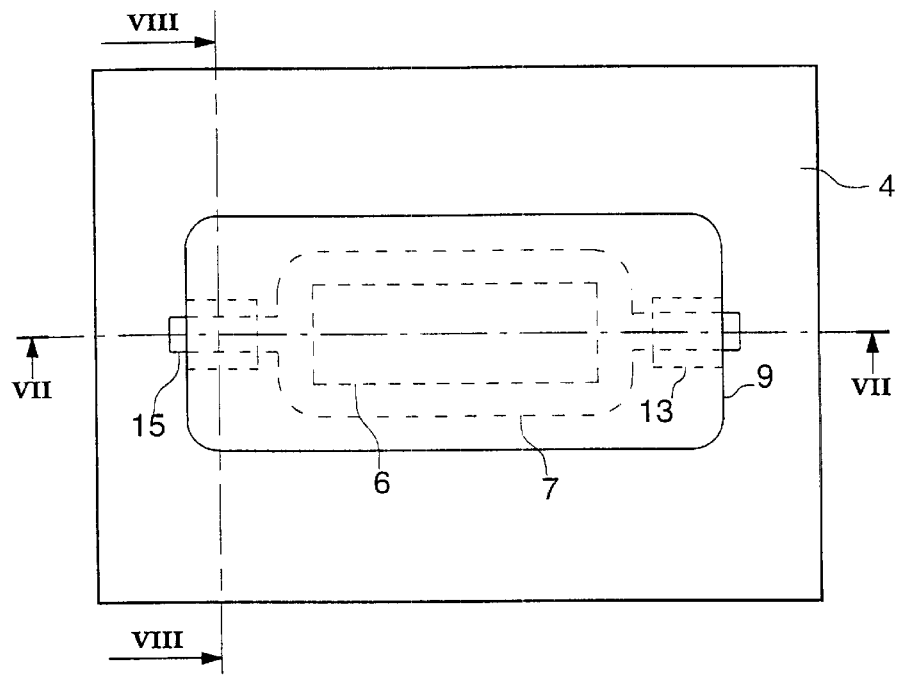
FIGS. 7a, 7b and 7c show a top view and cross-section along VII—VII and VIII—VIII of FIG. 7a after the deposition of a second metal layer above the sacrificial layer which is formed of a different metal according to a second embodiment.
Figure 7B:
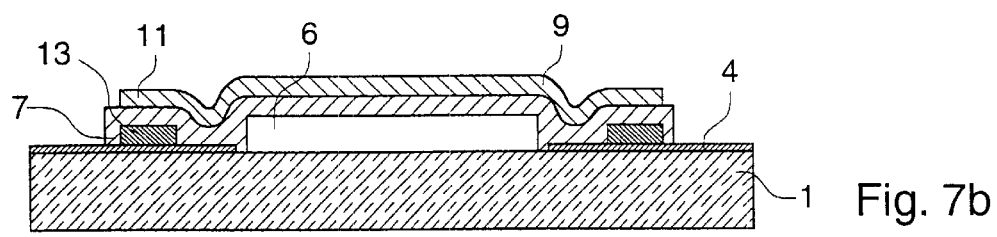

In FIGS. 7a and 7b, a second metal layer 9, made in particular of gold or a gold alloy, is deposited by electrolytic means onto sacrificial layer 7 and onto parts of the adhesion layer. This layer 9 defines in a top view a rectangular shape stopping at the end of each extension 15 in order to avoid covering them completely. Passages 10 thus are created as a result of said extensions 15 coming out of second layer 9.

Figure 7C:
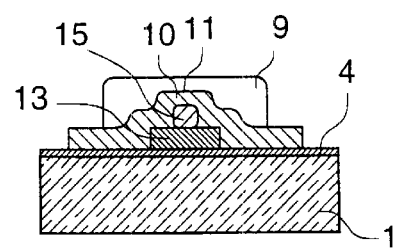

FIG. 7c is a cross-section along the line VII—VII of FIG. 7a and which shows the superposition of the various layers.

On insulating substrate 1, metal adhesion layer 4 includes solder bumps 13 formed in particular of a gold and tin alloy. Extension 15 of the sacrificial layer passes above solder bump 13. Second metal layer 9 passes above the sacrificial layer and is also connected on each side of extension 15 to solder bump 13.

Figure 8:
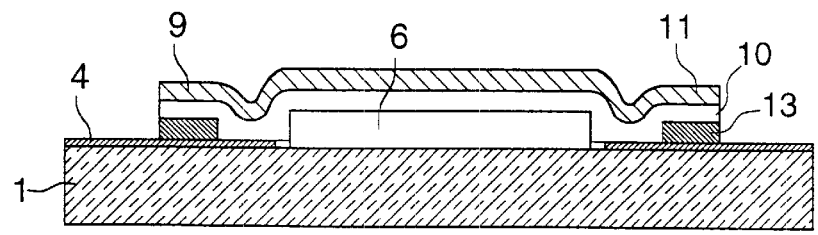
FIG. 8 shows a cross-section along VII—VII of FIG. 7a after removal of the sacrificial layer by chemical etching via the passages of the second layer according to a second embodiment.

FIG. 8 shows the removal of the sacrificial layer using a chemical etchant through passages 10. Said passages are obtained by the extensions of the sacrificial layer coming out of the second layer. After such removal, microsystem 6 is free inside metal capsule 9.

Figure 9:
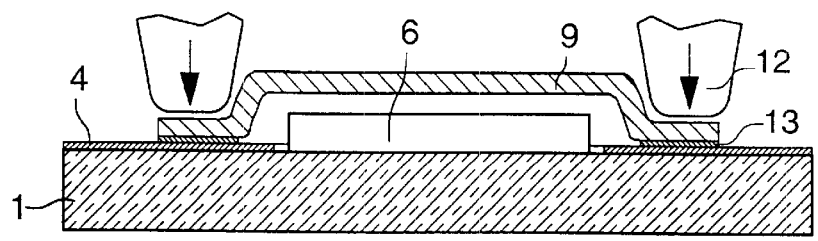
FIG. 9 shows a cross-section along VII—VII of FIG. 7a after the closing of the passages of the metal capsule of the microsystem according to a second embodiment.

FIG. 9 shows the closing of capsule 9 using a tool 12 pressing parts of second layer 9 located on solder bumps 13. During the compression of these parts, solder bumps 13 are heated to be melted and thus to seal passages 10. Given that the passages are of smaller size on two reinforced sides of second layer 9, it is no longer necessary to provide reinforcing pillars as for the first embodiment. The compression of the parts delimiting passages 10 will not damage microsystem 6.

FIGS. 10 to 15 show steps for hermetically encapsulating microsystems in situ according to a third embodiment of the method of the invention. It is to be noted that the elements of these Figures, which correspond to those of FIGS. 1 to 5, bear identical reference numbers.

Figure 10:
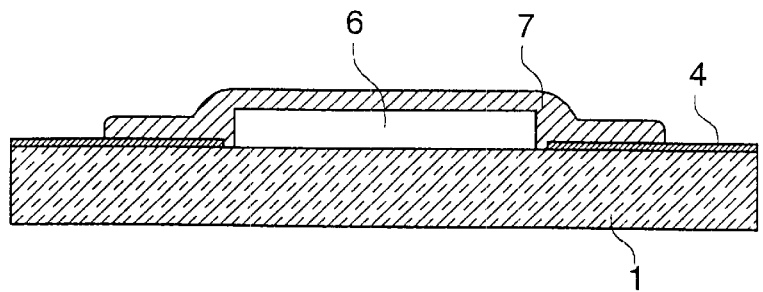
FIG. 10 shows a vertical cross-section after the deposition of a sacrificial layer on the microsystem and on the adhesion layer according to a third embodiment.

FIG. 10 shows the deposition in particular by electrolytic means of a sacrificial metal layer 7, made in particular of copper or a copper alloy, on an annular zone of the metal adhesion layer 4 surrounding microsystem 6 and on said microsystem in order to cover it completely. Although electrically connected, sacrificial layer 7 deposited on microsystem 6 is not contiguous with the sacrificial layer of a neighbouring microsystem on the same substrate 1, since it is only deposited on a limited annular zone around the respective microsystem.

Figure 11:
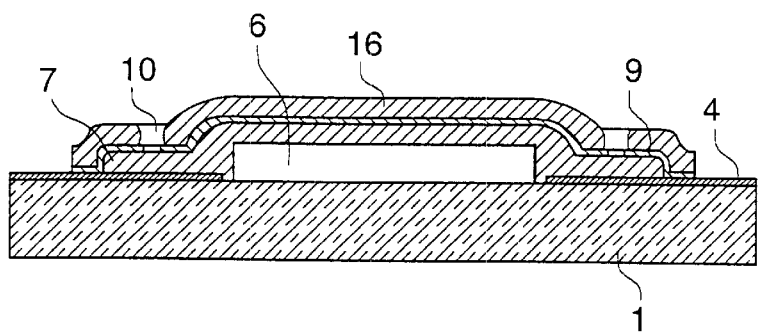
FIG. 11 shows a vertical cross-section after the deposition of a second and third metal layers on the sacrificial layer according to a third embodiment.

FIG. 11 shows the successive depositions by electrolytic means of a second metal layer 9, made in particular of gold or a gold alloy, and a third metal layer 16, made in particular of copper or a copper alloy like the sacrificial layer. These layers are deposited above sacrificial layer 7 and on an annular zone surrounding sacrificial layer 7. Two passages 10 are made in the two layers 9 and 16 to provide access to sacrificial layer 7. The shape of the passages could be oblong or circular or square.

The same photoresist layer is used for the two successive metal depositions. The second metal layer 9 has a small thickness of the order of 0.5 $\mu$m whereas third metal layer 16 has a thickness of the order of 20 $\mu$m so that the final metal capsule resists mechanical stress. This allows a sufficiently thick capsule to be made as well as savings given that the second layer is preferably made of gold or a gold alloy.

Figure 12:
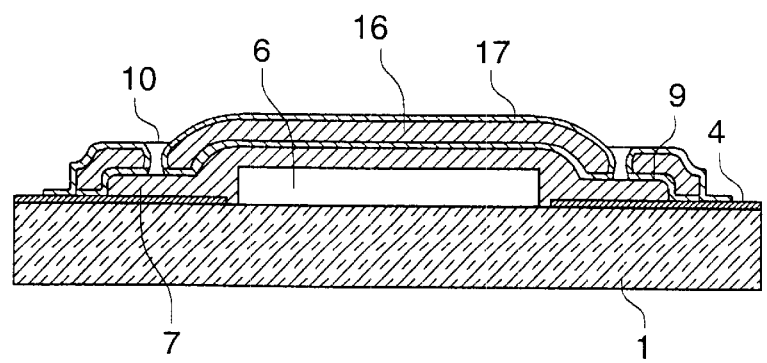
FIG. 12 shows a vertical cross-section after the deposition of a fourth metal layer of the same metal as the second layer on the third metal layer according to a third embodiment.

As third layer 16 is preferably made of the same metal as the sacrificial layer in order to use the same electrolyte baths, it is necessary to protect it from any chemical etchant. In order to do this, as shown in FIG. 12, a fourth metal layer 17 of an identical metal to the second layer is deposited on the third layer and on an annular zone surrounding it. This fourth metal layer is connected to the second layer while leaving passages 10 free. The third layer is consequently entirely inserted between the second and fourth metal layers and is thus protected from any chemical etchant for the removal of sacrificial layer 7. The thickness of the fourth layer is of the order of 0.5 $\mu$m.

Figure 13:
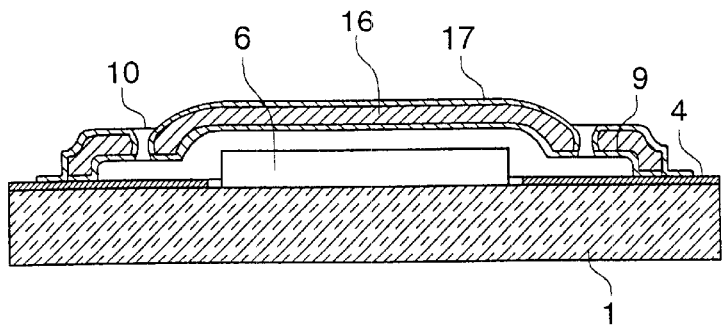
FIG. 13 shows a vertical cross-section after the removal of the sacrificial layer by chemical etching through the passages of the second layer according to a third embodiment.

FIG. 13 shows the removal of sacrificial layer 7 by a chemical etchant passing through passages 10, the third layer being protected by the second and fourth layers.

Figure 14:
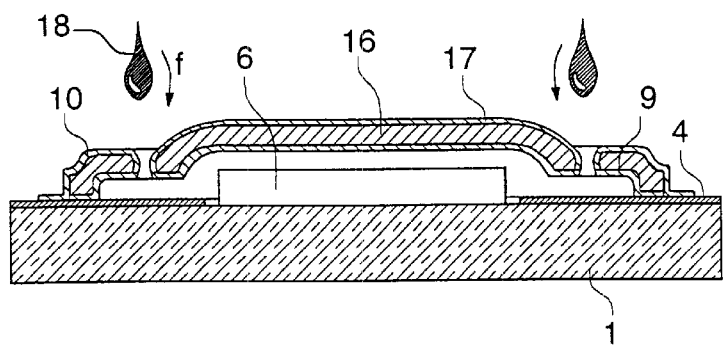
FIG. 14 shows a vertical cross-section prior to the addition of drops of solder on the passages of the second layer for closing the metal capsule according to a third embodiment.
Figure 15:
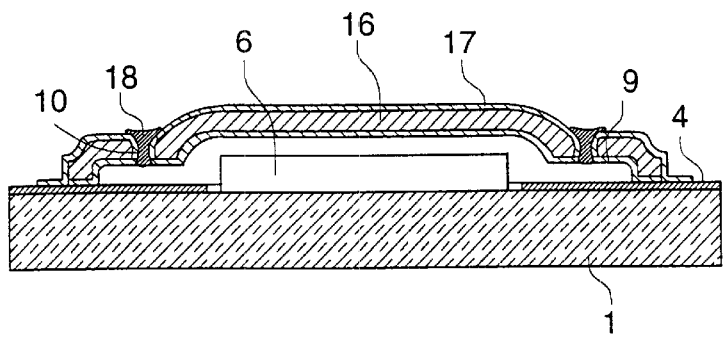
FIG. 15 shows a vertical cross-section after the closing of the metal capsule with the solidified drops of solder according to a third embodiment.

FIGS. 14 and 15 show the structure after the removal of the sacrificial layer, microsystem 6 being free of movement in the capsule. For example in the case of a contactor, metal strips thereof are free to move. Solder drops 18 are then brought by a tool (not shown) onto each passage 10 in the direction of arrow f and are solidified in order to seal the passages and to hermetically close the capsule.

FIGS. 16 to 19 show steps for hermetically encapsulating microsystems in situ according to a fourth embodiment of the method of the invention. It is to be noted that the elements of these Figures, which correspond to those of FIGS. 1 to 5, bear identical reference numbers.

Figure 16A:
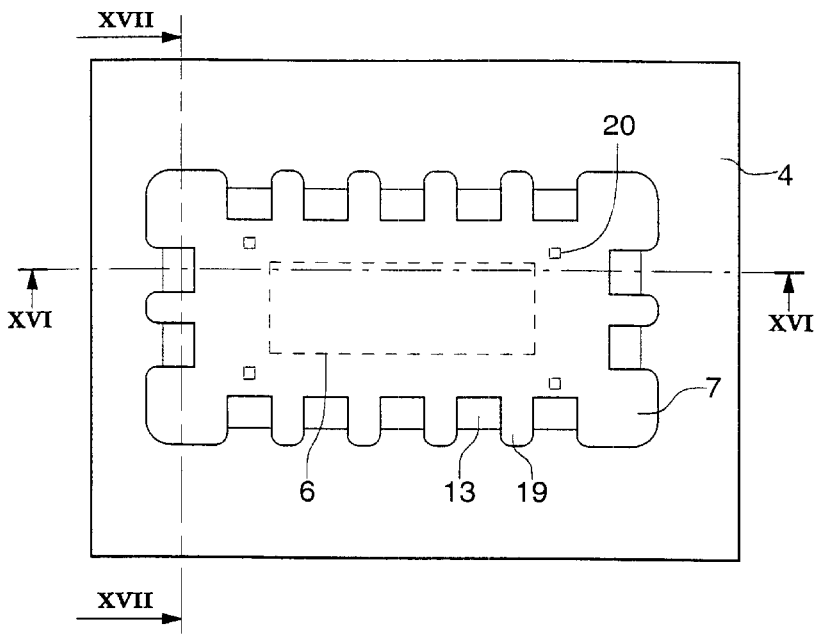
FIGS. 16a, 16b and 16c show a top view and cross-section along XVI—XVI and XVII—XVII of FIG. 16a after the deposition of a sacrificial metal layer on the microsystem and on the adhesion layer and passing around solder bumps of the adhesion layer according to a fourth embodiment.
Figure 16B:
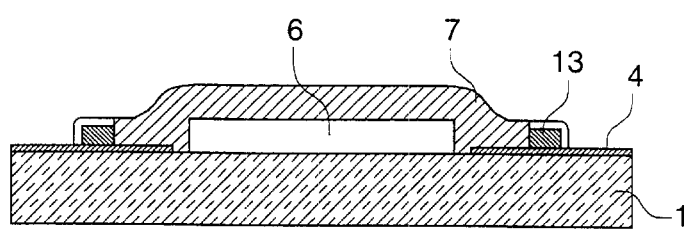
Figure 16C:
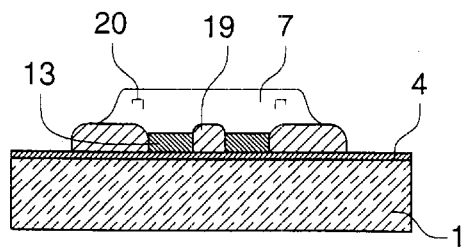

In FIGS. 16a, 16b and 16c, a series of solder bumps 13 of adhesion layer 4 were made around microsystem 6 in a preceding step of the method, as well as guide elements 20 placed in the direction of the corners of the microsystem and inside the series of solder bumps. These guide elements 20 are formed of a different metal to solder bumps 13 and sacrificial layer 7 to withstand in particular higher temperatures than solder bumps 13. They are used to guide second layer 9 when the capsule is closed as discussed hereinafter.

Said bumps can be regularly spaced over the entire periphery of the microsystem without being in direct contact with said microsystem 6. A sacrificial layer 7 is deposited by electrolytic means on microsystem 6 and on an annular zone of adhesion layer 4 without passing above said solder bumps 13. For that, a photoresist masking has been previously provided. However, parts 19 of the sacrificial layer are disposed in the spaces between the solder bumps in order to be able to create passages in the second metal layer. One can see said passages in FIG. 16c which is a cross-section along the line XVII—XVII of FIG. 16a.

Figure 17:
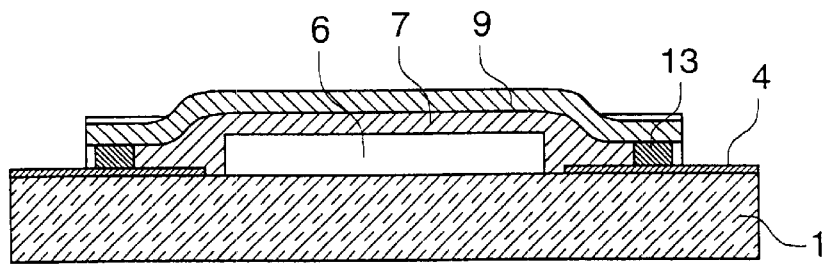
FIG. 17 shows a cross-section along XVI—XVI of FIG. 16a after the deposition of a second metal layer on the sacrificial layer and on the solder bumps of the adhesion layer according to a fourth embodiment.

In FIG. 17, a second metal layer 9 is deposited by electrolytic means on sacrificial layer 7 and on solder bumps 13. The second layer does not come into contact with the base layer of adhesion layer 4, since it does not extend beyond the periphery of sacrificial layer 7. Consequently it lets portions 19 of the sacrificial layer emerge from second metal layer 9 in order to be able to define passages 10, visible in FIG. 18, in the spaces between solder bumps 13.

Figure 18:
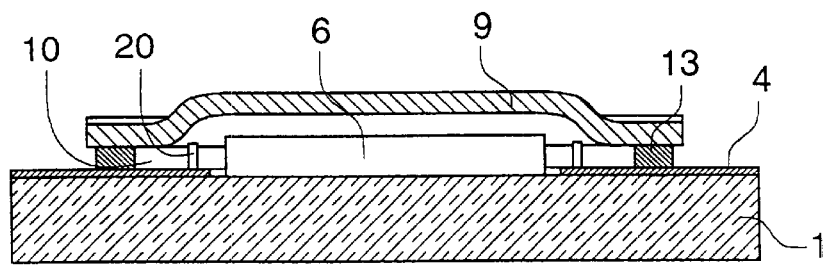
FIG. 18 shows a cross-section along XVI—XVI of FIG. 16a after the removal of the sacrificial layer through the passages of the second layer between the solder bumps according to a fourth embodiment.

In FIG. 18, sacrificial layer 7 has been removed using a chemical etchant through parts 19, i.e. through passages 10 of second layer 9. This second layer 9 appears, after removal of the sacrificial layer, like a roof resting on the series of solder bumps 13 and sheltering microsystem 6.

Figure 19:
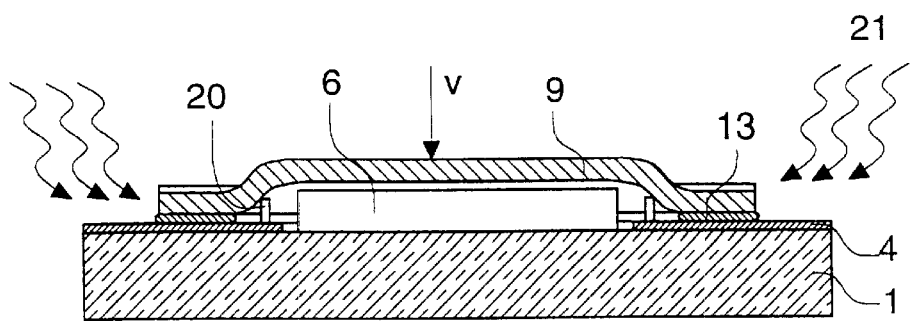
FIG. 19 shows a cross-section along XVI—XVI of FIG. 16a after the closing of the metal capsule by heating the solder bumps according to a fourth embodiment.

The hermetic closing of the metal capsule is shown in FIG. 19. Substrate 1 with all the microsystems under their capsule is placed in an oven to bring a heat wave 21 towards solder bumps 13 to make them melt. As soon as solder bumps 13 melt, capsule 9 is lowered in direction v by its own weight and by capillarity to close the microsystem hermetically by sealing all the passages. Since when solder bumps 13 melt, the capsule no longer has a fixed point of support, it may move in a horizontal direction and come into contact with the microsystem. Guide elements 20 shown as being four in number in FIGS. 16 to 19 are thus provided to prevent the capsule moving too far in the horizontal direction and becoming fixed to the adhesion layer using solder bumps 13 at a location able to disturb the proper operation of microsystem 6.

The stick shape given by way of illustration in FIGS. 16 to 19 for guide elements 20 is not limiting, since these elements could take other forms. For example, one could use only two guide elements 20 arranged close to two opposite corners of microsystem 6. These two elements may be cylindrical or L-shaped. Of course, the use of these guide elements is not obligatory, provided one ensures that the descent of second layer 9 occurs exclusively in a vertical manner.

Since solder bumps 13 are made of a gold and tin alloy or a tin and lead alloy and second layer 9 resting on said bumps is made of gold or a gold alloy, there is a risk of diffusion of the bump alloy in the second layer when they are melted by heat wave 21. Consequently, too large a quantity of melted material is liable to no longer guarantee sufficient space for the microsystem. In order to prevent such diffusion, those skilled in the art know how to place a diffusion barrier between solder bumps 13 and second layer 9.

Figure 20A:
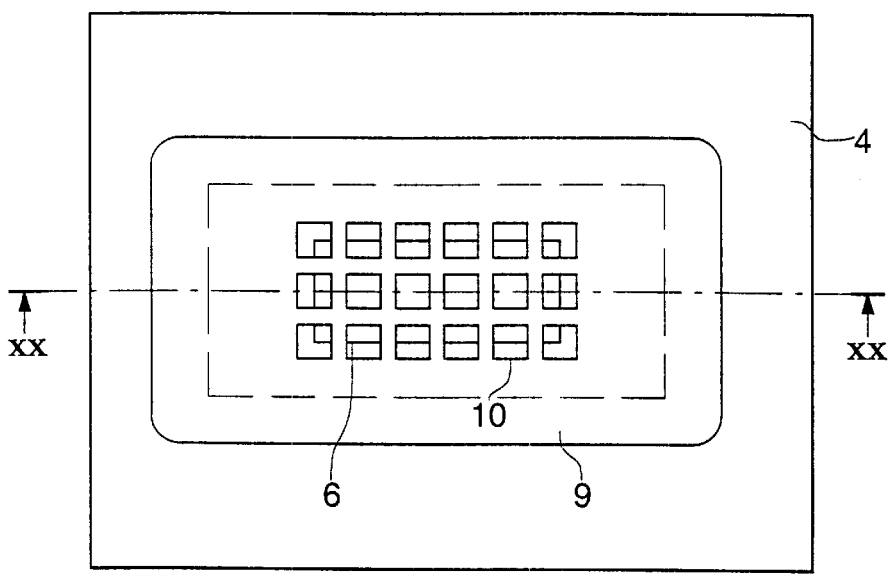
FIGS. 20a and 20b show a top view and a cross-section along XX—XX of FIG. 20a after the removal of the sacrificial layer through a multitude of passages in the second layer according to a fifth embodiment.
Figure 20B:
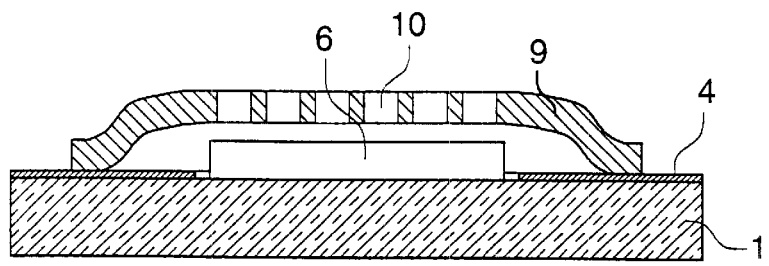
Figure 21:
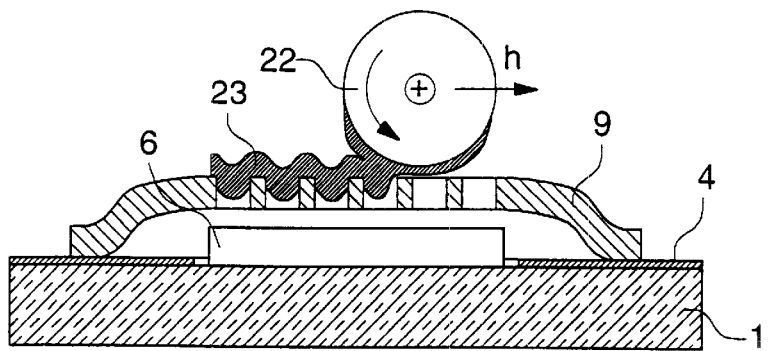
FIG. 21 shows a cross-section along XX—XX of FIG. 20a after the closing of the metal capsule by a wave of liquid solder according to a fifth embodiment.

FIGS. 20 and 21 show two final steps for hermetically encapsulating microsystems in situ according to a fifth embodiment of the method of the invention. It is to be noted that the elements of these Figures, which correspond to those of FIGS. 1 to 5, bear identical reference numbers.

FIGS. 20a and 20b show the metal capsule formed by second metal layer 9, made in particular of gold or a gold alloy, with the multitude of passages 10 made over its top portion. The sacrificial layer has been removed through the passages 10 using a selective chemical etchant. This capsule has been deposited on an annular zone of adhesion layer 4 around the microsystem and encloses without contact said microsystem 6.

Passages 10 are of sufficiently small size to be able to be placed on the top portion of the capsule and allow them to be sealed by a liquid solder wave 23. Said solder wave is brought by a rotating cylindrical tool 22 moving in a direction h above substrate 1, as can be seen in FIG. 21, or by a continuous solder wave. As a result of the capillarity effect, liquid solder 23 will seal said passages 10 without risking coming into contact with microsystem 6.

Cylindrical tool 22 includes inside one or more supply conduits for liquid solder 23, not visible in FIG. 21. Liquid solder opens out via close together orifices, made on the periphery of the cylinder in order to create a wave of liquid solder 23. The width of the tool is such that in a single passage over the substrate, it allows all the passages 10 made in the second layer of all the encapsulated microsystems to be sealed. It is to be noted that the surface evenness of the top portions of the second layer is of the order of more or less 10 μm, so that the tool can seal all the passages once without too much difficulty.

Instead of rotating tool 22 for sealing passages 10, substrate 1 carrying all the microsystems 6 encapsulated by second layer 9 could be brought above a solder bath. For that, the contact pads, connected to the conductive strips which were explained in FIGS. 1 to 5, have not to be covered. For this operation, it is possible to leave the photoresist used to form the second layer which protects said pads, as well as the end of the conductive strips.

In this fifth embodiment, passages 10 are arranged like a grid on the top portion of second layer 9 in the same way as that which could be achieved within the knowledge of those skilled in the art with a porous polysilicon layer. By way of reference, one can refer to the article of the 12th IEEE international conference MEMS 99 of Jan. 17 to 21, 1999, entitled, "Micro Electro Mechanical Systems" at pages 470 to 475. This polysilicon layer is used in certain microsystem encapsulations for the removal of a sacrificial layer by a chemical etchant passing through said porous polysilicon.

The encapsulation method which has just been described could also be applied to the encapsulation of a single microsystem mounted on a substrate. However, in order to reduce as much as possible the manufacturing costs in this field of micrometric devices, it is more economical to encapsulate several microsystems on a common substrate at the same time.

Other variants or combinations of preceding embodiments for an hermetic metal encapsulation of microsystems which were not explained above, but are within the grasp of those skilled in the art, may also be envisaged without departing from the scope of the invention.

What is claimed is:

1. A method for hermetically encapsulating microsystems in situ, said microsystems being three-dimensional structures comprising microoptoelectromechanical or microelectromechanical devices, wherein, in a first phase, several microsystems are mounted on a common substrate, said microsystems being surrounded by a metal adhesion layer deposited on the substrate, wherein, in a second phase, in a common deposition step a sacrificial first metal layer is deposited on each microsystem and on an annular zone of the adhesion layer surrounding each microsystem, so as to completely cover each microsystem by overlap, wherein a second metal layer is deposited by electrolytic means on the first metal layer and on the adhesion layer so as to cover the first layer over most of its surface, leaving at least one passage per microsystem in the second layer to provide access to the first layer, the metal of the first layer being different from the metal of the adhesion layer, the second layer and the microsystem, wherein the first layer is removed by selective chemical etching through each passage of the second layer, and wherein said passages are then closed to obtain metal capsules hermetically enclosing each microsystem.

2. A method according to claim 1, wherein the first layer is deposited by electrolytic means.

3. A method according to claim 1, wherein the first layer coating each microsystem includes at least two openings each arranged between the microsystem and the corresponding passage of the second layer, and wherein the second layer extends into each of the openings as far as the adhesion layer so as to create a support pillar for the second layer between each passage and the corresponding microsystem.

4. A method according to claim 1, wherein said passages are formed by means of two extensions facing the first layer for each microsystem, said extensions coming out outside the second layer, the width of which does not vary between said extensions so as to create a reinforcing part at the passages.

5. A method according to claim 1, wherein the second layer is deposited so as to enclose the first layer with the exception of a multitude of passages of reduced dimensions arranged on the top portions of the second layer above each microsystem.

6. A method according to claim 3, wherein the passages arranged on the top portions of the second layer are closed by depositing a drop of solder to be solidified on each passage or by causing a wave of liquid solder to be solidified to close all said passages.

7. A method according to claim 1, wherein the passages are closed by heating and compressing portions of the second layer around each passage and by soldering them to the adhesion layer.

8. A method according to claim 7, wherein the adhesion layer includes bumps of a soldering metal arranged on a metal base layer of said adhesion layer and at the location of the passages of the second layer so as to close said passages when the portions of the second layer are thermocompressed.

9. A method according to claim 1, wherein the second layer rests on the soldering metal bumps of the adhesion layer distributed over the perimeter of each annular zone surrounding the corresponding microsystem, and wherein a portion of the first layer is arranged between neighbouring metal bumps to come out outside the second layer and to define several passages of the second layer per microsystem.

10. A method according to claim 9, wherein the passages for each microsystem are closed by heating the soldering metal bumps to cause the second layer to be lowered onto a base layer of the adhesion layer and to hermetically seal the capsules onto the microsystems.

11. A method according to claim 10, wherein guide elements for the capsules are secured to the adhesion layer before being coated by the first layer, said elements remaining after removal of the first layer and being used to guide the capsules vertically when the second layer is lowered to close the passages.

12. A method according to claim 1, wherein the metal of the first layer is copper or a copper alloy, and in that the metal of the second layer is gold or a gold alloy.

13. A method according to claim 1, wherein the metal base layer of the adhesion layer is made of a first metal fixing layer on the substrate made of titanium or chromium, a second metal layer made of nickel or palladium or rhodium or ruthenium or molybdenum or platinum as a diffusion barrier for the solder, and a third metal layer made of gold as oxidation protection.

14. A method according to claim 1, wherein a third metal layer is deposited on the second layer without closing the passages of the second layer, wherein a fourth metal layer is deposited on the third layer in order to completely enclose the third layer between the second layer and the fourth layer closing obstructing the passages of the second layer, the metal of the second layer being the same as the metal of the fourth layer, and wherein the first layer is removed by selective chemical etching through each passage.

15. A method according to claim 1, wherein, prior to mounting the microsystems, conductive strips for the external electric connection of each microsystem are made on the substrate, wherein an insulating layer is deposited on the median portion of the length of the strips, leaving their ends free for an electric connection, and wherein the adhesion layer is then deposited so as to pass over the insulation of the strips and structured so as to define metal paths connected to one of the ends of the conductive strips, the other end of the strips being connected to the corresponding microsystem.

16. A method according to claim 1, wherein, prior to mounting the microsystems, a series of conductive holes are made through an insulating part of the substrate for the external electric connection of each microsystem, and wherein metal pads are connected to the conductive holes on the surface of the substrate opposite the microsystems.

17. A method according to claim 1, wherein after closing the capsules, they are covered with a protective layer of resin.

18. A method according to claim 1, wherein after closing the metal capsules, the substrate is cut or diced in order to separate each encapsulated microsystem having metal contact pads which are accessible from the exterior.

19. A method according to claim 5, wherein the passages arranged on the top portions of the second layer are closed by depositing a drop of solder to be solidified on each passage or by causing a wave of liquid solder to be solidified to close all said passages.

* * * * *